(12) United States Patent
Sakuma et al.

(10) Patent No.: US 11,824,037 B2
(45) Date of Patent: Nov. 21, 2023

(54) ASSEMBLY OF A CHIP TO A SUBSTRATE

(71) Applicant: International Business Machines Corporation, Armonk, NY (US)

(72) Inventors: Katsuyuki Sakuma, Fishkill, NY (US); Mukta Ghate Farooq, Hopewell Jct, NY (US); Paul S. Andry, Yorktown Heights, NY (US); Russell Kastberg, Modena, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 17/139,298

(22) Filed: Dec. 31, 2020

(65) Prior Publication Data

US 2022/0208719 A1     Jun. 30, 2022

(51) Int. Cl.
*H01L 21/00*     (2006.01)
*H01L 23/00*     (2006.01)
(Continued)

(52) U.S. Cl.
CPC ............ *H01L 24/75* (2013.01); *B23K 1/0016* (2013.01); *H01L 21/76895* (2013.01); *H01L 2224/81203* (2013.01)

(58) Field of Classification Search
CPC ............... H01L 24/75; H01L 21/76895; H01L 2224/81203; H01L 2224/32225; H01L 2224/73204; H01L 2224/13082; H01L 2224/16225; H01L 2224/92125; H01L 21/563; H01L 24/03; H01L 24/11;
(Continued)

(56) References Cited

U.S. PATENT DOCUMENTS 5,177,134 A    1/1993   Mullen, III
5,488,200 A    1/1996   Tsukada
(Continued)

FOREIGN PATENT DOCUMENTS

| CN | 105280596 A | 1/2016 |
|---|---|---|
| DE | 69205134 T2 | 5/1996 |
| WO | WO2016111142 A1 | 7/2016 |

OTHER PUBLICATIONS

Examiner Nadeem Khan, United Kingdom Intellectual Property Office, Combined Search and Examination Report, related British application GB2117762.1, 8 pages total, dated May 19, 2022.
(Continued)

*Primary Examiner* — Kiley S Stoner
(74) *Attorney, Agent, or Firm* — Daniel Morris; Otterstedt & Kammer PLLC

(57) ABSTRACT

An exemplary method includes at a bonding temperature, bonding a semiconductor chip to an organic laminate substrate using solder; without cooldown from the bonding temperature to room temperature, at an underfill dispense temperature, dispensing underfill between the semiconductor chip and the organic laminate substrate; and curing the underfill within a range of temperatures above the underfill dispense temperature. Another exemplary method includes depositing a first solder on pads of an organic laminate substrate; contacting a second solder on pillars of a semiconductor chip to the first solder on the pads of the organic laminate substrate; and solder bonding the semiconductor chip to the organic laminate substrate.

4 Claims, 10 Drawing Sheets

(51) Int. Cl.
*H01L 21/768* (2006.01)
*B23K 1/00* (2006.01)

(58) Field of Classification Search
CPC ....... H01L 2021/60022; H01L 2924/14; H01L 21/4825; H01L 21/4835; H01L 2021/60045; H01L 2021/60067; H01L 2021/60217–60262; H01L 23/3128; H01L 23/4952; H01L 23/49811; H01L 23/49816; H01L 2224/10–17519; H01L 2224/02333; H01L 2224/03912; H01L 2224/03914; H01L 2224/0401; H01L 24/742; H01L 24/81–82; B23K 1/0016; B23K 13/01; B23K 20/023; B23K 2201/36; B23K 2201/38; B23K 2201/40; B23K 2201/42; H05K 3/341; H05K 3/3494; H05K 3/3436; H05K 3/4092; H05K 2201/0347; H05K 2201/09836; H05K 2201/09845; H05K 2201/10734; H05K 2203/0338; H05K 2203/1189
USPC .................. 228/180.22, 207, 223, 215–216; 438/612–626; 257/737–738
See application file for complete search history.

(56) References Cited

U.S. PATENT DOCUMENTS

| | | | |
|---|---|---|---|
| 6,367,150 B1 | 4/2002 | Kirsten | |
| 6,570,029 B2 | 5/2003 | Wang | |
| 6,796,481 B2 | 9/2004 | Yamauchi | |
| 6,919,224 B2 | 7/2005 | Sane | |
| 7,087,458 B2 | 8/2006 | Wang | |
| 7,588,968 B1 | 9/2009 | Zarbock | |
| 8,083,121 B2* | 12/2011 | Maeda | B23K 35/3613 228/208 |
| 8,803,337 B1* | 8/2014 | Lin | H01L 29/40 257/781 |
| 9,099,364 B1* | 8/2015 | Hsu | H01L 24/11 |
| 9,324,557 B2* | 4/2016 | Cate | H01L 21/563 |
| 9,613,888 B2 | 4/2017 | Yoneyama | |
| 9,768,142 B2* | 9/2017 | Lin | H01L 25/50 |
| 9,860,996 B2 | 1/2018 | Interrante | |
| 9,875,986 B2 | 1/2018 | Sakuma | |
| 9,890,244 B2 | 2/2018 | Tsang | |
| 10,535,608 B1* | 1/2020 | Rubin | H01L 24/17 |
| 10,879,202 B1* | 12/2020 | Lewandowski | G11C 11/44 |
| 11,069,664 B2* | 7/2021 | Kim | H01L 25/50 |
| 2001/0028109 A1 | 10/2001 | Shimizu | |
| 2002/0119396 A1 | 8/2002 | Jiang | |
| 2002/0140094 A1* | 10/2002 | Kubota | H05K 3/3436 257/E21.511 |
| 2002/0142517 A1* | 10/2002 | Maeda | H01L 24/81 257/E21.511 |
| 2005/0017376 A1* | 1/2005 | Tsai | H01L 24/13 257/E23.021 |
| 2007/0178688 A1* | 8/2007 | Shiu | H05K 3/3485 257/E23.021 |
| 2009/0098666 A1 | 4/2009 | Hering | |
| 2009/0200663 A1* | 8/2009 | Daubenspeck | H01L 23/49816 257/E21.511 |
| 2011/0151627 A1* | 6/2011 | Graf | H01L 24/11 257/E21.506 |
| 2012/0318854 A1 | 6/2012 | Tsang | |
| 2012/0252168 A1* | 10/2012 | Nah | H01L 21/4853 257/E21.502 |
| 2013/0196499 A1* | 8/2013 | Burgess | H01L 21/76838 438/614 |
| 2014/0061897 A1* | 3/2014 | Lin | H01L 24/17 257/737 |
| 2015/0001704 A1* | 1/2015 | Lu | H01L 24/81 257/737 |
| 2015/0382480 A1* | 12/2015 | Frick | H05K 3/34 228/180.1 |
| 2016/0043051 A1* | 2/2016 | Lin | H01L 24/11 257/737 |
| 2016/0336292 A1* | 11/2016 | Tian | H01L 24/75 |
| 2017/0141073 A1* | 5/2017 | Lu | H01L 24/05 |
| 2018/0090459 A1* | 3/2018 | Kim | H01L 24/83 |
| 2018/0151537 A1* | 5/2018 | Huang | H01L 23/49827 |
| 2019/0043829 A1* | 2/2019 | Kelly | H01L 25/50 |
| 2019/0259722 A1* | 8/2019 | Pokhrel | C25D 5/18 |
| 2019/0295979 A1* | 9/2019 | Wang | H01L 25/50 |
| 2019/0296001 A1 | 9/2019 | Ohda | |
| 2019/0326161 A1 | 10/2019 | Kelly | |
| 2020/0108459 A1* | 4/2020 | Lee | H01L 21/4853 |
| 2020/0219786 A1 | 7/2020 | Hung | |
| 2021/0066239 A1* | 3/2021 | Moreno | H01L 23/4951 |
| 2021/0090983 A1* | 3/2021 | Lin | H01L 23/481 |

OTHER PUBLICATIONS

Anonymous. General Soldering Temperature Process Guidelines. NXP Semiconductors Application Note. Aug. 2017. 4 pages.
Anonymous. Semiconductor Packaging. Nordson Electronics Solutions. Dec. 2020. 2 pages.
A. Mackie. Thermocompression Bonding for Microbump Flip-Chip Soldering. Indium Corp. Blogs. Jun. 2011. 5 pages.
Anonymous. Low Temperature Solder Bonding. Shinko Electric Industries Co, Ltd. Dec. 2020. 3 pages.
R. Made et al., Study of Low-Temperature Thermocompression Bonding in Ag-In Solder for Packaging Applications. J. Electronic Materials. Oct. 2008. 7 pages.
M. Farooq et al., Mitigating Cooldown Peeling Stress During Chip Package Assembly, U.S. Appl. No. 17/139,313, Dec. 2020. 27 pages.
K. Sakuma et al., Fluxless Bonding for Fine-pitch and Low-volume Solder 3-D Interconnections. Proc 2011 Electronic Components and Technology Conference. May 2011. 7 pages.
A. Harrison, IBM Appendix P, Dec. 2020, 2 pages.
Response dated Mar. 2, 2023 to United Kingdom Intellectual Property Office, Combined Search and Examination Report dated May 19, 2022 in related British application GB2117762.1, 8 pages total.
Related German application No. Application No. 102021131417.8 filed Nov. 30, 2021 office action dated Aug. 25, 2022 5 pages plus translation.
Response dated Oct. 27, 2022 to office action dated Aug. 25, 2022 in related German application number Application No. 102021131417.8 36 pages plus translation.
Daniel Portch, Elkington and Fife LLP. Counterpart UK Patent Application No. 2117762.1 Response to the examination report dated Mar. 27, 2023. May 4, 2023. pp. 10.
Counterpart application GB2117762.1 United Kingdom Intellectual Property Office. Examination Report under Section 18(3). dated Mar. 27, 2023. pp. 4.

* cited by examiner

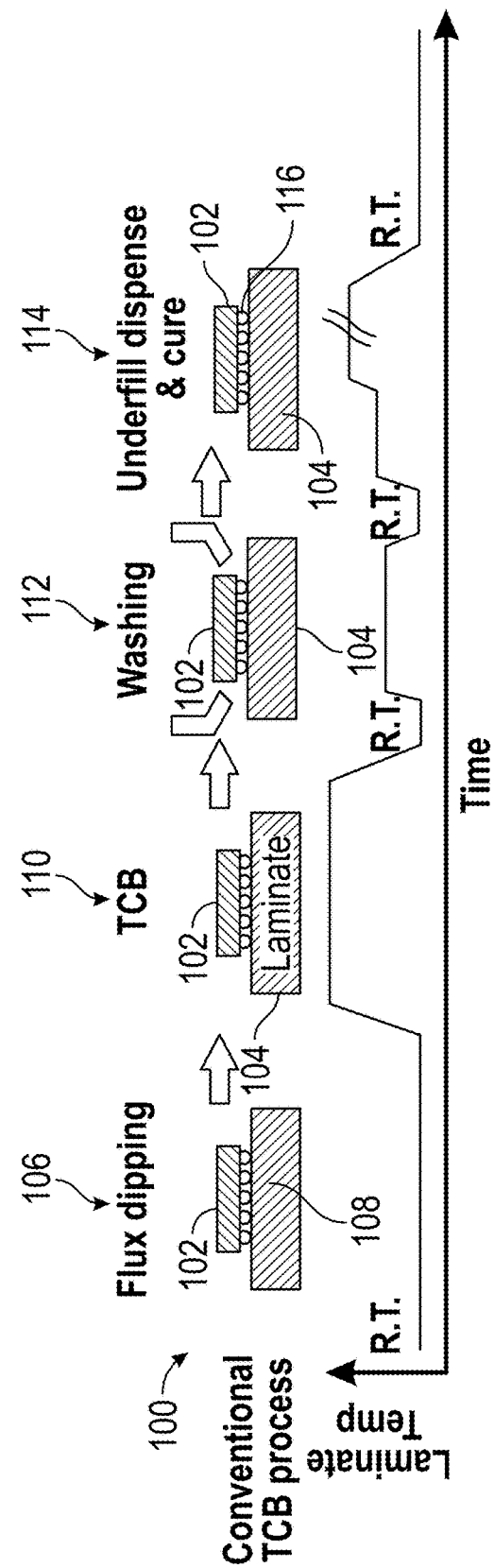
FIG. 1 - PRIOR ART
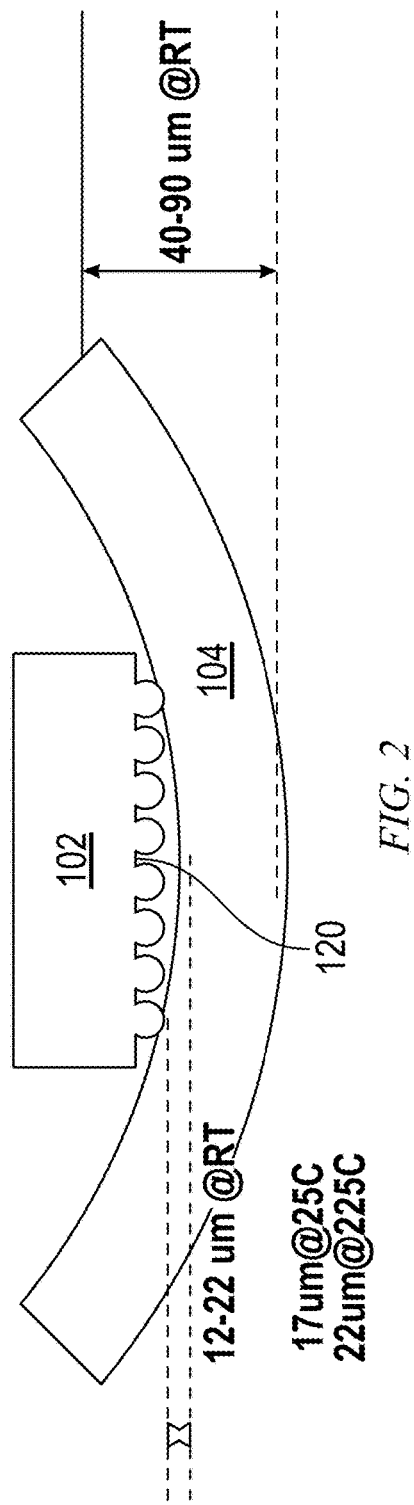
FIG. 2

ASSEMBLY OF A CHIP TO A SUBSTRATE

BACKGROUND

The present invention relates to the electrical, electronic, and computer arts, and more specifically, to integrated circuit (IC) chip package assembly.

It is well known that miniaturization of IC technology continues at a rapid pace. The most recently accomplished technology node is 5 nm (nanometer) transistor scale, enabling densities of 134 million transistors per square millimeter within a chip. However, interconnecting a chip with high-density bump interconnection and an organic laminate substrate is difficult. The connector pitch (center to center distance between adjacent connectors) limits how rapidly data can be transferred to or from a chip, and thereby puts a ceiling on achievable performance, not only in multi-chip packages, but also in realistic single-chip packages that work with off-chip memory modules. A current target for chip-to-laminate connections is sub-55 µm (micron) pitch.

Just as quantum tunneling is a challenge for increasing transistor density, nearest neighbor shorting during solder bond is a challenge for tightening chip connector pitch. One approach to reduce the risk of shorting is to reduce the amount of solder provided in each controlled collapse chip connector (C4) bump on a chip.

Another challenge in reducing chip connector pitch is the expected deformation of chips and substrates that occurs during thermal excursions for common processing steps. Thermal strain, caused by differences in coefficient of thermal expansion (CTE) between semiconductor chips and organic laminate substrates, has always been a factor to be considered in aligning chip connectors to substrate pads. At tight pitches, on the order of 55 µm or less, thermal strain is more likely to produce misalignment and misconnections.

SUMMARY

Principles of the invention provide techniques for assembly of a chip to a substrate. In one aspect, an exemplary method includes at a bonding temperature, bonding a semiconductor chip to an organic laminate substrate using solder; without cooldown from the bonding temperature to room temperature, at an underfill dispense temperature, dispensing underfill between the semiconductor chip and the organic laminate substrate; and curing the underfill within a range of temperatures above the underfill dispense temperature.

According to another aspect, an exemplary method includes depositing a first solder on pads of an organic laminate substrate; contacting a second solder on pillars of a semiconductor chip to the first solder on the pads of the organic laminate substrate; and solder bonding the semiconductor chip to the organic laminate substrate.

According to another aspect, an exemplary apparatus includes a semiconductor chip 401 that has pillars 402 protruding from a lower surface thereof at a pitch of 55 µm (microns) or smaller, with caps 406 of first solder affixed to lower ends of the pillars; an organic laminate substrate 403 that has pads 404 protruding from an upper surface thereof at the same pitch as the semiconductor chip, with caps 408 of second solder affixed to upper faces of the pads; and two or more dots of volatile tacky adhesive 1208 attaching the upper surface of the organic laminate substrate to the lower surface of the semiconductor chip.

In view of the foregoing, techniques of the present invention can provide substantial beneficial technical effects. For example, one or more embodiments provide one or more of:

Underfill reducing thermal strain and protecting chip connectors from shear stress during cooldown from solder bond to room temperature.

Enhanced reliability of solder connections from chip to organic substrate at sub-55 µm C4 pitches.

Generally, underfill before cooling is an advantageous technology. It is most effective for bonding a large chip with fine pitch bumps to a warped substrate, but it can be used regardless of the size of the chip or the size of the microbumps, and it can also be applied to bridge chip assemblies. It can be used to join not only a single chip but also multiple chips to the same substrate.

These and other features and advantages of the present invention will become apparent from the following detailed description of illustrative embodiments thereof, which is to be read in connection with the accompanying drawings.

BRIEF DESCRIPTION OF THE DRAWINGS

FIG. 1 depicts in a schematic a prior art process for bonding a semiconductor chip to an organic substrate.

FIG. 2 depicts in a schematic warpage of the organic laminate substrate shown in FIG. 1.

DETAILED DESCRIPTION

Figure 3:
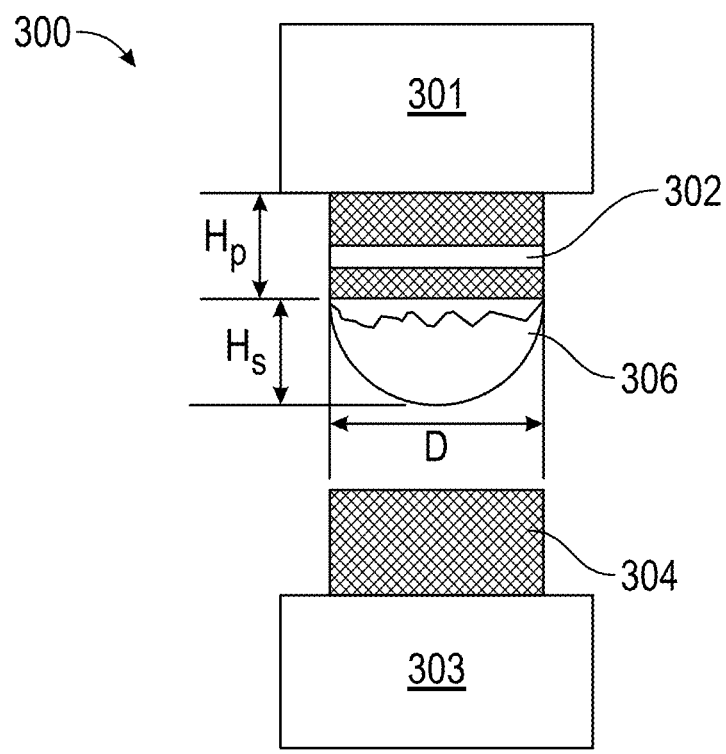
FIG. 3 depicts a copper pillar and a non-limiting exemplary Cu/Ni/Pd/Au surface finish pad with one solder cap on the pillar.

Referring to FIG. 1, a prior art process 100 for bonding a semiconductor chip 102 to an organic laminate substrate 104 includes several steps. At 106, dip the chip 102 in a flux bath 108. At 110, thermocompression bond the fluxed chip 102 to the substrate 104. At 112, wash out the flux residue from between the chip 102 and the substrate 104. At 114, dispense and cure underfill 116 between the chip 102 and the substrate 104.

Step 106, flux dipping, occurs at room temperature. Fluidization of the flux solids is done at higher temperature (typically between 90° C. (Celsius) and 150° C.). Step 110, thermocompression bonding, is done at a yet higher temperature (typically between 235° C. and 245° C.; generally, at least 20° C. to 30° C. hotter than solidus temperature of solder). Step 112, flux washing, is, however, done at or near room temperature (typically between about 70° C. and 90° C.). Step 114, underfill dispense is accomplished at a somewhat warmer temperature (typically between about 80° C. and 120° C.) and then underfill cure is accomplished at another elevated temperature (typically between about 120° C. and 160° C.

We have found that when we attempted to connect a large silicon chip with 40 μm pitch I/O to an organic substrate, using conventional belt furnace reflow as commonly used to bond silicon chips to organic substrates, it was unsuccessful. One of the reasons for this is the laminate warpage, both at room temperature and near the melting point of the solder, wherein the amount of warping is greater than the solder height of the microbumps. In normal chip laminate mounting, it is common to use C4 solder with a diameter of 80 μm or more, instead of microbumps, and this works well because solder of this diameter can follow the laminate to some extent even if it is warped. It is very difficult to connect a large silicon chip with narrow pitch microbumps directly to an organic substrate, however. The cooldown thermal excursion between step 110 (thermocompression bonding) and step 112 (flux washing) exerts thermomechanical strain on the solder bonds between the chip 102 and the substrate 104, due to coefficient of thermal expansion (CTE) mismatch between these two components. Generally, the organic laminate substrate 104 has a CTE 3 to 10 times larger than the chip. Therefore, as shown in FIG. 2, a surface 120 of the substrate 104 that faces the chip 102 is closer to the chip at low temperature (e.g., room temperature) than at higher temperatures (e.g., bonding temperature).

Repeated thermal cycles of the substrate 104, during or before chip assembly, induce warpage, as shown in FIG. 2. Typical warpage produces curvature of the substrate at room temperature, amounting (in a non-limiting example) to about 12-22 μm (microns) difference of vertical distance between a 30 mm (millimeter) chip and the substrate, comparing edge to center of the chip, between room temperature and typical solder bonding temperature. This exemplary value is the amount of warpage only for this particular laminate; the amount of warpage varies greatly depending on the thickness, size, material, and structure of the laminate. For example, if the core material of the laminate is thin, the amount of warpage can exceed 100 microns. Even if a laminate with a thicker core is used to keep warpage low, as in this case, if the chip is large and the bumps have a fine pitch, bonding is quite difficult. Typical warpage of the substrate 104 produces undesirable results, such as large chips (on the order of 30 mm) being able to wet the substrate pads with solder only around their edges during reflow or other bonding processes.

Additionally, with an Au surface finish on the pad there is a problem with solder from the semiconductor chip wetting the sides of pads on the organic laminate substrate, rather than filling a joint between the semiconductor chip pillars and the substrate pads. This happens because Au is a very wettable material during solder reflow.

For example, FIG. 3 depicts a chip assembly 300. The chip assembly 300 includes a semiconductor chip 301 with a sub-55 μm pitch Cu pillar 302, and an organic laminate substrate 303 with a substrate connector pad 304. There is a solder cap/microbump 306 on the pillar 302, according to conventional practice. For fine pitch bonding, pillars and microbumps are used instead of C4 balls. The pillars are made of high melting point material such as Cu (and even Ni) and low melting point material solder cap. The pillar composition is layered Cu/Ni/Cu/SnAg. The first Cu is used to increase the height, Ni is used as a barrier layer, and the second Cu is used to react with the SnAg when it melts. The pillar's height $H_p$ is 5-30 μm. The pad composition is layered Cu/Ni/Pd/Au with a gold coating layer. For example, the layers are 5-20 μm Cu, 0.5-5 μm Ni, 0.02-0.2 μm Pd, 0.01-0.2 μm Au. The pillar 302 and the pad 304 have relatively high melting points according to their compositions, while the solder cap 306 has a lower melting point according to its composition. The diameter D of the pillar 302 (about 10-30 μm) and surface tension of the liquid solder constrains the height Hs and volume of the solder cap 306 to approximately a hemisphere of 5-15 μm radius. This volume of solder is not sufficient to wet both the sides and the top of the pad 304, and as a result, during reflow the solder wets the sides of the pad 304, leaving very little solder on the top. Within the desired connector pitch specification, it is not possible to make the pillar 302 thicker. Therefore, it is not possible to put more solder on the pillar.

Figure 4:
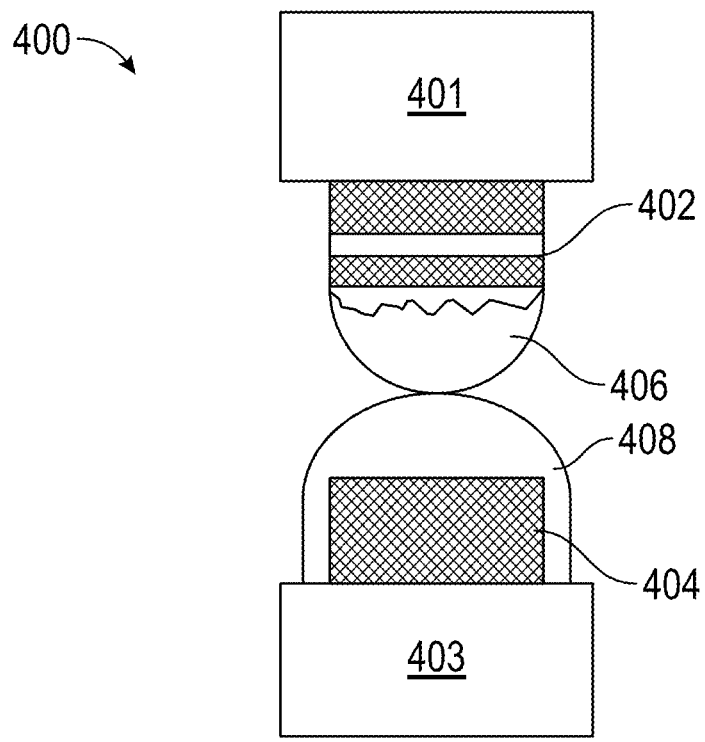
FIG. 4 depicts a copper pillar and a gold/palladium pad with one solder cap on the pillar and another solder cap on the pad, according to an exemplary embodiment.

According to an aspect of this disclosure, we considered that it might be feasible to modify the conventional chip assembly process in such a way that solder also is present on the pad 304 during reflow/bonding. Accordingly, FIG. 4 depicts a detail view of a chip assembly 400, which includes a C4 pillar 402 protruding downward from a chip 401 and a substrate pad 404 protruding upward from a substrate 403. There is one solder cap/microbump 406 on the pillar 402 and another solder cap/microbump 408 on the pad 404, according to an exemplary embodiment. The combined heights and volumes of the two solder caps 406, 408 accommodate the warpage-induced gap between the chip 401 and the substrate 403, and provide sufficient solder at the bonding interface even if it is wetted and spread over the side of the pad 404.

One or more embodiments advantageously achieve the structure illustrated in FIG. 4, which is foreign to conventional chip assembly. Aspects of the disclosure provide several techniques for producing the solder cap 408 on the substrate pad 404, prior to chip reflow/bonding.

Figure 5:
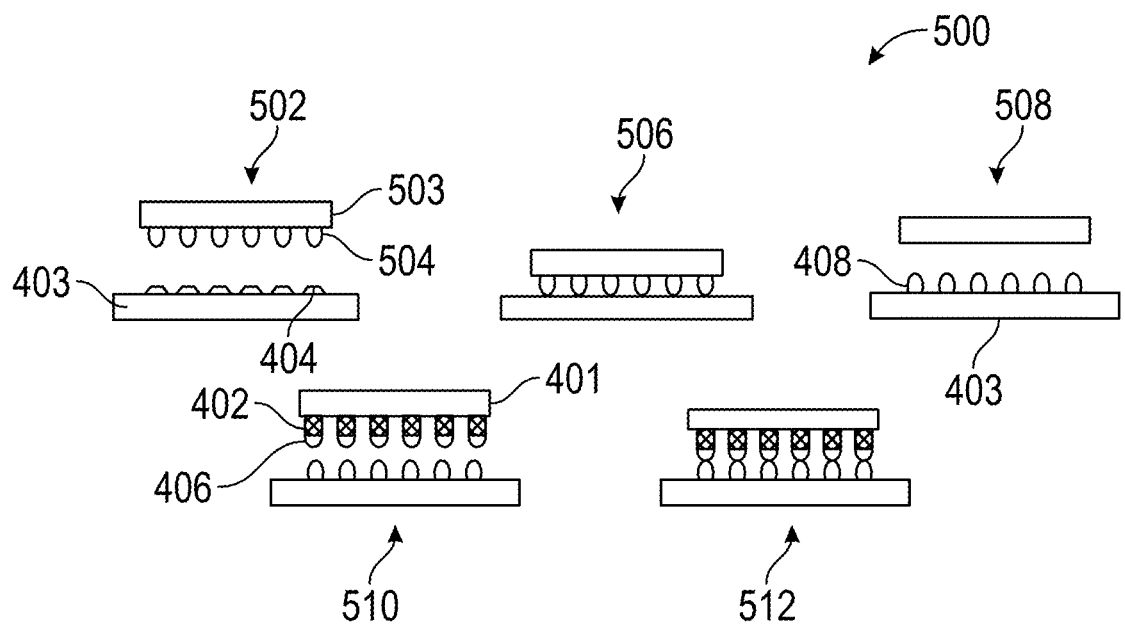
FIG. 5 depicts in a schematic a process for bonding a chip to a substrate according to an exemplary embodiment.

FIG. 5 depicts in a schematic a process 500 for bonding a chip 401 to a substrate 403 according to an exemplary embodiment. At 502, provide a transfer die 503 that has bumps 504 of low-melting-point solder, e.g., SnBi (tin-bismuth), as a particular example, $Sn_{42}Bi_{58}$. Such a solder has a eutectic melting point of 139° C. At 506, transfer the solder bumps 504 from the transfer die 503 to the pads 404 of the substrate 403 by reflowing the solder at relatively low temperature, i.e., 139° C. to 150° C. At 508, pull the transfer die 503, leaving the low melting point solder as bumps 408 on the pads 404. At 510, provide the chip 401 that has solder bumps 406 of SnAg (tin-silver) or similar solder on its pillars 402. SnAg solder has a melting point of about 221° C. At 512, bond the chip 401 to the substrate 403 by heating the assembly to a bonding temperature, e.g., 139° C. to 150° C. Because the low temperature SnBi solder is used, the bonding temperature advantageously is lower than a conventional range of 235° C. to 245° C. for reflow of SnAg solder or the like. The lower temperature reduces thermal excursion and accompanying thermomechanical strain, thereby mitigating warpage of the substrate 403. It also allows for only local melting, rather than conventional complete C4 solder melting. Localized melting reduces nearest-neighbor shorting, thereby enabling reduced (finer) pitch. Because the SnAg solder of bumps 406 will dominate the joint after reflow (in one or more embodiments, bumps 406 are larger than bumps 408, and the Bi from bumps 408 will just become part of a ternary composition with SnAg), the joint will not melt at design operating temperature of 150° C.

Figure 6:
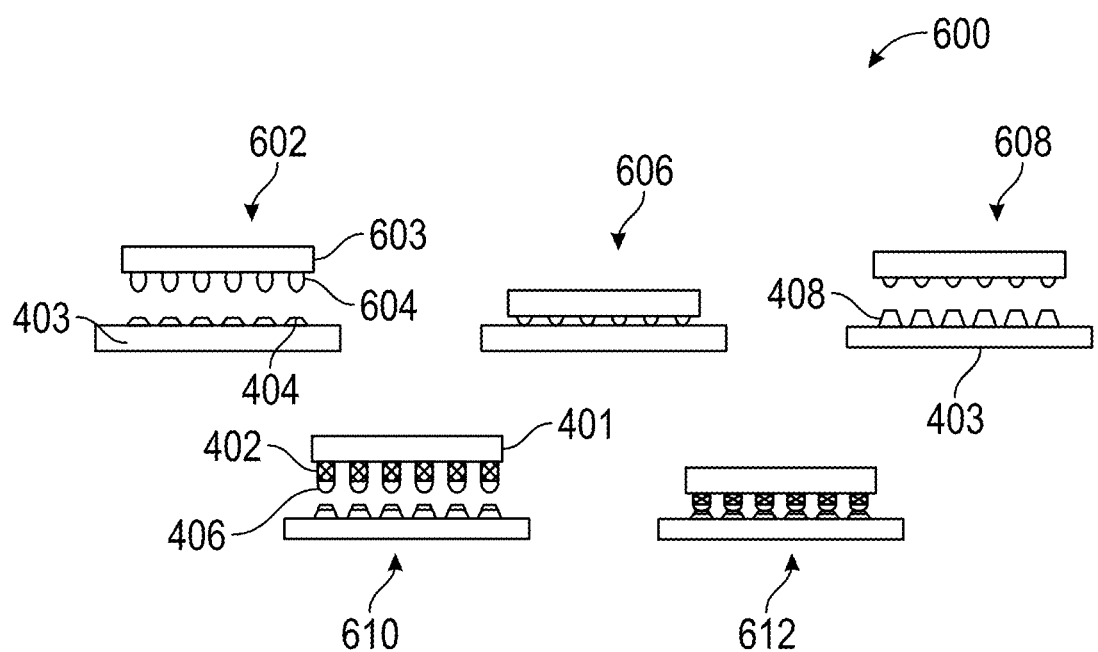
FIG. 6 depicts in a schematic a process for bonding a chip to a substrate according to another exemplary embodiment.

FIG. 6 depicts in a schematic a process 600 for bonding a chip 401 to a substrate 403 according to another exemplary embodiment. At 602, provide a solder-only die 603 that has bumps 604 of solder, e.g., SnAg solder. At 606, transfer a portion of each solder bump 604 to pads 404 of the substrate 403, forming bumps 408 on the pads 404. At 608, retract the solder-only die 603. At 610, provide the chip 401 with pillars 402 that have solder bumps 406. At 612, bond the chip 401 to the substrate 403 by heating to temperature range of 235° C. to 245° C., thereby reflowing the solder bumps 406, 408.

Figure 7:
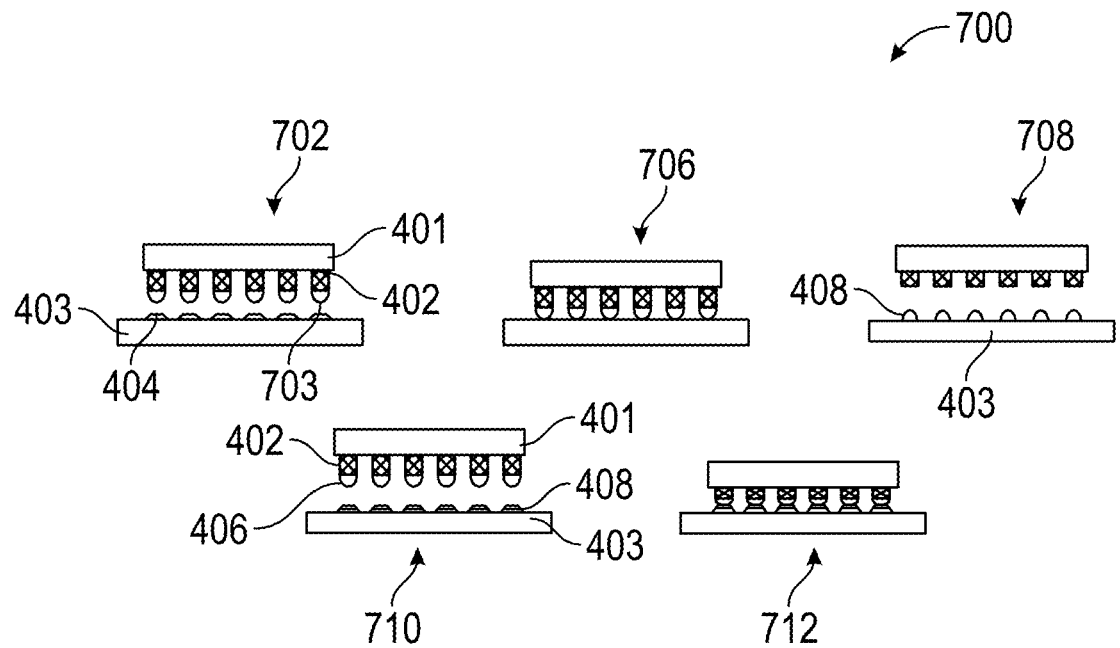
FIG. 7 depicts in a schematic a process for bonding a chip to a substrate according to yet another exemplary embodiment.

FIG. 7 depicts in a schematic a process 700 for bonding a chip 401 to a substrate 403 according to yet another exemplary embodiment. At 702, present the chip 401 with solder bumps 703 on its pillars 402. At 706, transfer solder bumps 703 from the pillars 402 to the pads 404 of the substrate 403 by reflow, thereby forming bumps 408 on the pads. At 708, retract the chip 401 to obtain additional solder. At 710, provide the chip 401 with (additional) solder bumps 406 on the pillars 402. At 712, bond the chip 401 to the substrate 403 by thermal compression bonding of the solder bumps 406, 408 in a temperature range of 235° C. to 245° C.

Considering that the chip bonding processes 500, 600, 700 incorporate a novel structure that to some extent overcomes the known and long-standing problem with substrate warpage inhibiting adequate solder wetting, other aspects of this disclosure relate to additional advances that are possible with solder caps on both the pillar and the pad.

Figure 8:
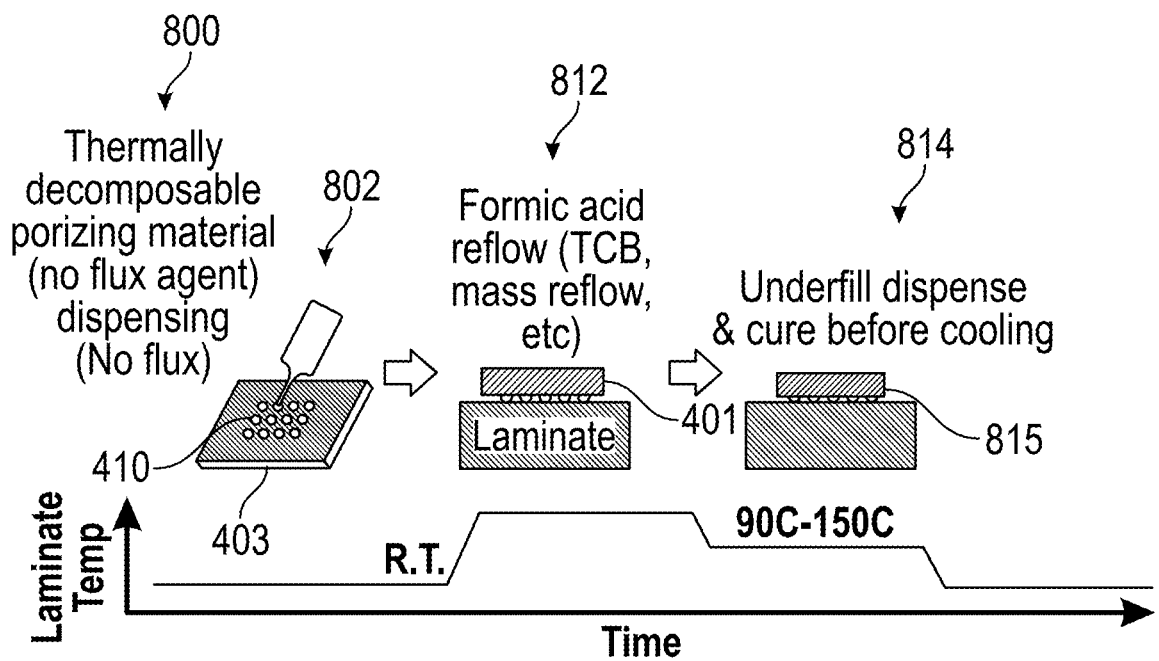
FIG. 8 depicts in a schematic a process for bonding a semiconductor chip to an organic substrate, according to an exemplary embodiment.

For example, FIG. 8 depicts in a schematic a process 800 for bonding a semiconductor chip 401 to an organic substrate 403, according to an exemplary embodiment.

At 802, dispense a volatile tacky adhesive (VTA) 410 onto the substrate 403. The VTA 410 is placed at least at the corners of the chip 401 footprint. VTAs, generally, evaporate at temperatures greater than 180° C., e.g., between 190° C. and 250° C., so that after reflow the volatile tacky adhesive is not present. Suitable VTAs include, for example, alcohols such as C-9-11-iso-C-1-rich, which has a viscosity of more than 30 kcP (kilocentipoise) at room temperature, and boiling temperature of about 180-250° C. The VTA can be applied to the chip side instead of the substrate side.

At 812, bond the chip 401 to the substrate 403. The bonding can be, for example, at a temperature of 235° C. to 245° C.: in a belt furnace reflow capable of creating a formic acid atmosphere, in a chamber-type formic acid oven, or in a thermocompression bonder (TCB) where the chip bonding is done in formic acid atmosphere. Alternatively, if a different method than formic acid atmosphere (e.g., HCl etching) is used to reduce the oxide films on the solder and components, the bonding can be accomplished by reflow in a belt furnace or chamber oven at a temperature of 235° C. to 245° C. under atmosphere of less than 100 ppm oxygen. At 812, the solder bumps on the chip pillars meld with the solder caps on the substrate pads. However as far as this method is concerned, it is not an absolute requirement that the pad on the laminate side has solder. This method can be applied to chips and boards of any structure.

By using a VTA for attaching the chip 401 to the substrate 403 just before bonding, and using formic acid atmosphere in place of solder flux, it is advantageously possible to proceed from bonding (step 812) to underfilling (step 814) without an intermediate cooldown step for washing out flux from under the chip. In other embodiments, HCl etching may be used instead of formic acid atmosphere.

In one or more embodiments, no-clean flux can be used before bonding. Using no-clean flux in a belt furnace or the like, instead of a formic acid atmosphere, also enables underfill without cooldown for flux washing. The ordinary skilled worker is familiar with "no-clean" flux. No-clean flux is sometimes referred to as a flux that does not require cleaning, but it does not mean that the components/ingredients are completely removed from the laminate surface before and during the bonding process. Some combinations with underfill may cause underfill voids, which may affect reliability testing, so they may not be used for that reason.

At 814, dispense underfill 815 at about 100° C. (without prior cooldown to room temperature after bonding), then cure the underfill while holding at a temperature between the bonding temperature and room temperature, e.g., between 90° C. and 150° C.

Figure 9:
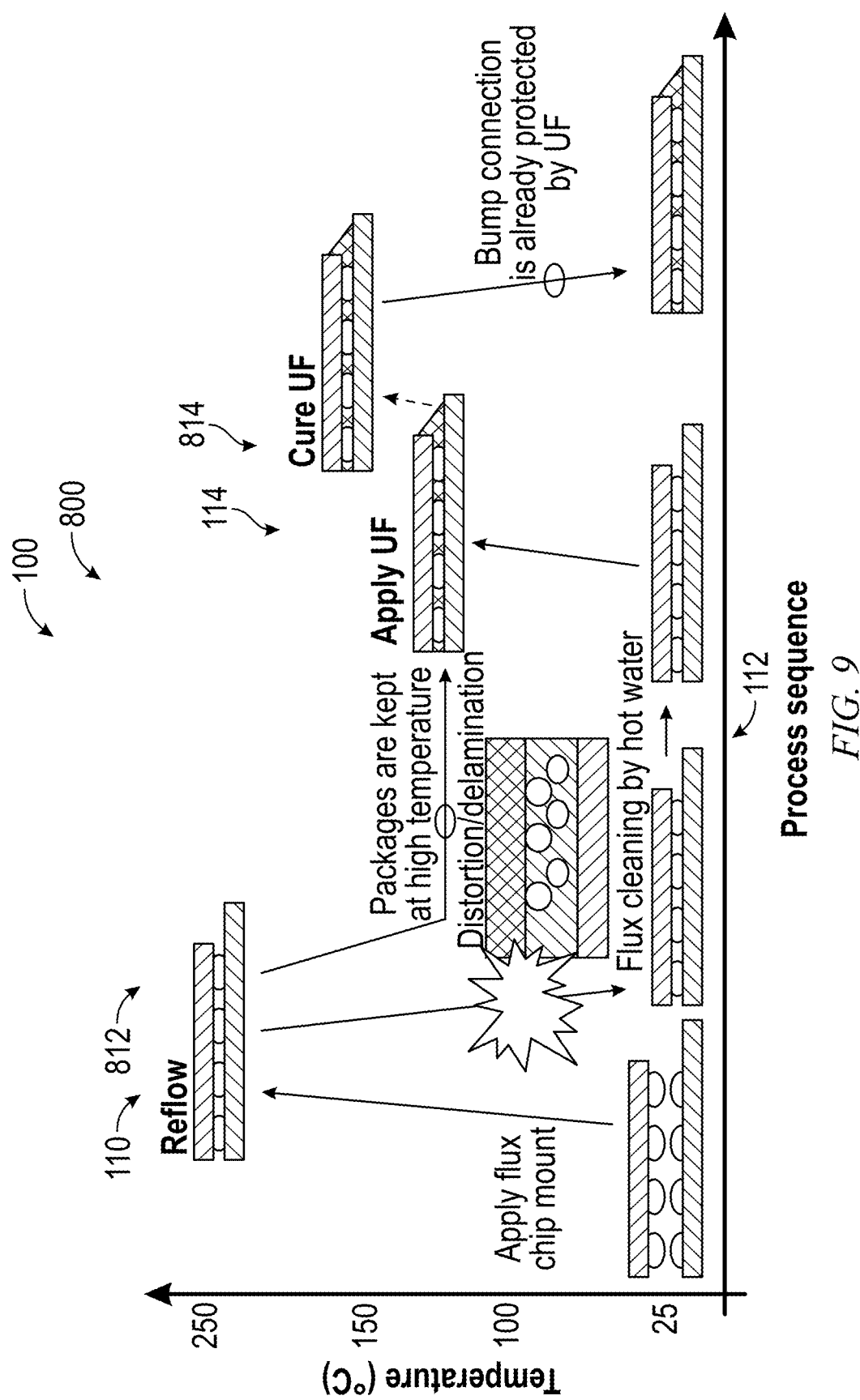
FIG. 9 depicts in a schematic a comparison of the processes of FIG. 1 and FIG. 8.

FIG. 9 depicts in a schematic a comparison of the processes 100, 800 of FIG. 1 and FIG. 8. The ordinary skilled worker will appreciate that the two processes diverge after bonding the chip 401 to the substrate 403, wherein for process 100 the package continues from step 110 (bonding) to step 112 (flux washing with hot water at 60° C. to 80° C.) before step 114 (underfill dispense and cure), whereas for process 800 the package proceeds directly from step 812 (bonding) to step 814 (underfilling) without intermediate lower temperature excursion.

Figure 10:
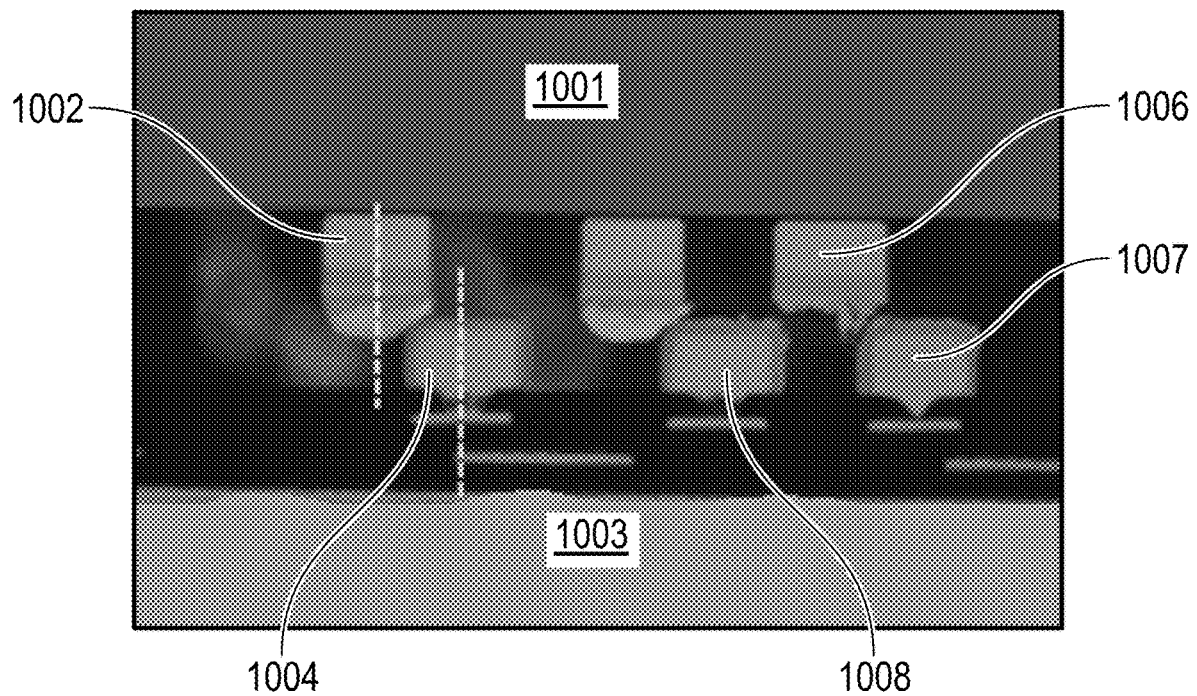
FIG. 10 depicts a cross-sectional image of a semiconductor chip bonded to a substrate according to the process of FIG. 1.

FIG. 10 depicts a cross sectional image of a semiconductor chip 1001 and a substrate 1003, after cooldown from step 110 (bonding) of the process 100 shown in FIG. 1. Due to differing coefficients of thermal expansion, at room temperature there is significant thermal strain between the chip 1001 and the substrate 1003, such that pillars 1002 of the chip 1001 do not align to pads 1004 of the substrate 1003. The ordinary skilled worker will notice that the rightmost pillar 1006 is aligned between the rightmost pad 1007 and the center pad 1008, a classic example of nearest-neighbor shorting. Underfilling this structure will lock in the misalignment.

Figure 11:
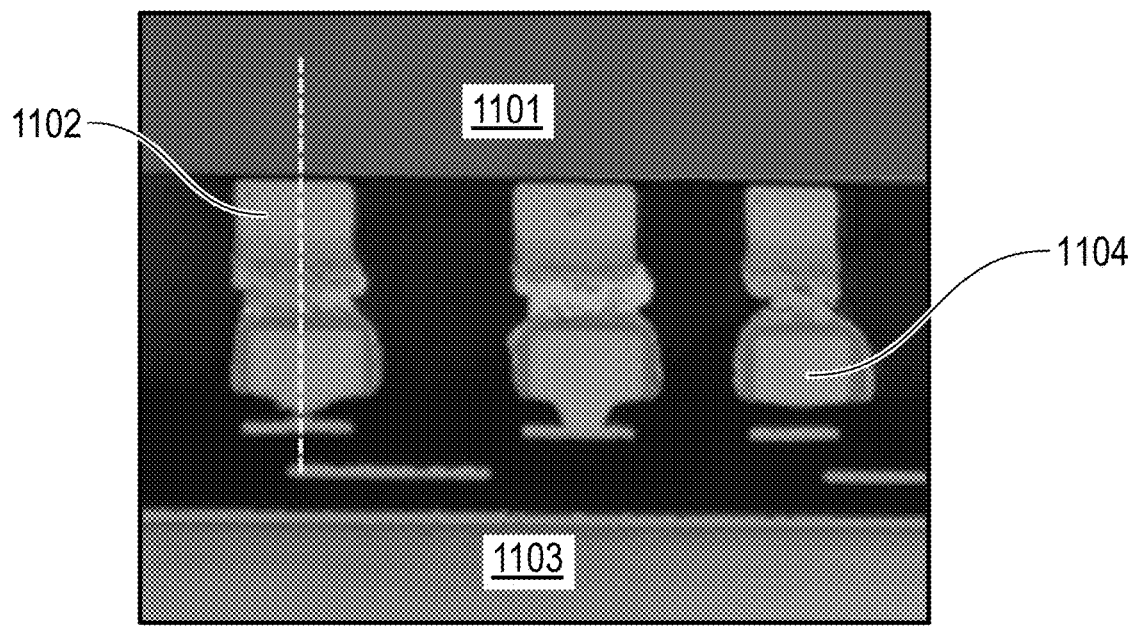
FIG. 11 depicts a cross-sectional image of a semiconductor chip bonded to a substrate according to the process of FIG. 8.

On the other hand, FIG. 11 depicts a cross sectional image of a semiconductor chip 1101 and a substrate 1103, after step 814 (underfilling) according to the process 800 shown in FIG. 8. The ordinary skilled worker will notice that because there was only a small thermal excursion from step 812 (bonding) to step 814 (underfilling), the underfill dispense and cure step locked in proper alignment of pillars 1102 to pads 1104.

Figure 12:
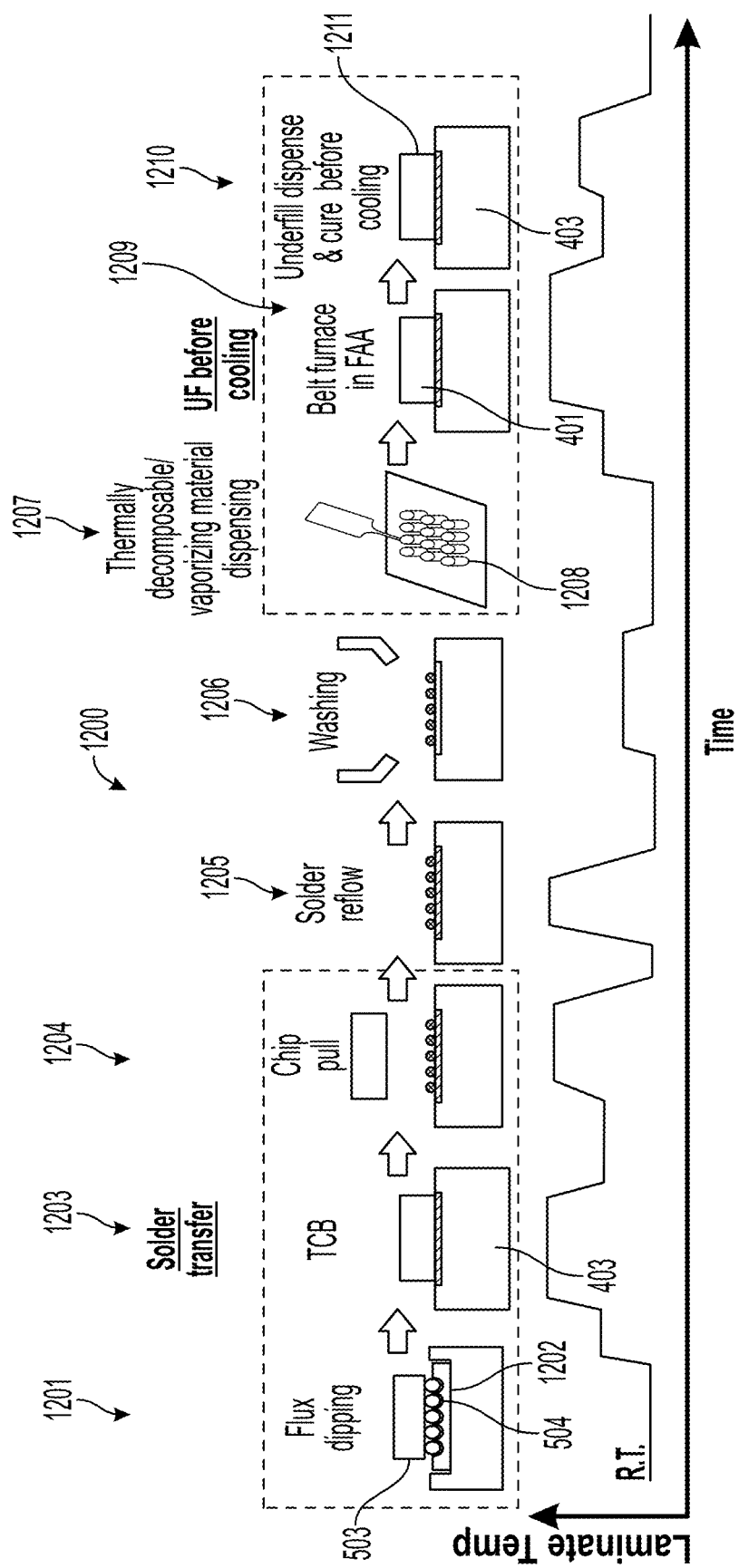
FIG. 12 depicts in a schematic another process for bonding a semiconductor chip to an organic substrate, according to an exemplary embodiment.

FIG. 12 depicts in a schematic another process 1200 for bonding a semiconductor chip 401 to an organic substrate 403, according to an exemplary embodiment. At 1201, dip a template die 503 with solder bumps 504 into a flux bath 1202 at room temperature. At 1203, transfer solder to the substrate 403 by thermal compression bonding. At 1204, pull the transfer die from the substrate. At 1205, reflow the solder at a temperature above solder solidus temperature. At 1206, slightly above room temperature (e.g., 80° C. to 100° C.), wash away remaining flux. At 1207, at room temperature, apply a tacky material 1208 that could be degraded and evaporated just below the solder reflow temperature to the board. At 1209, bond the chip 401 to the substrate 403 using a belt furnace in a formic acid atmosphere. At 1210, without intermediate cooldown to room temperature, proceed directly to dispense and cure underfill 1211 at a temperature appropriate for the underfill material, e.g., 80° C. to 120° C. Please note, in FIG. 12, in steps 1209 and 1210, there will be micro-bumps between elements 401 and 403; these details are omitted to avoid clutter. Exemplary views of micro-bumps and underfill are provided in the other drawing figures.

Figure 13:
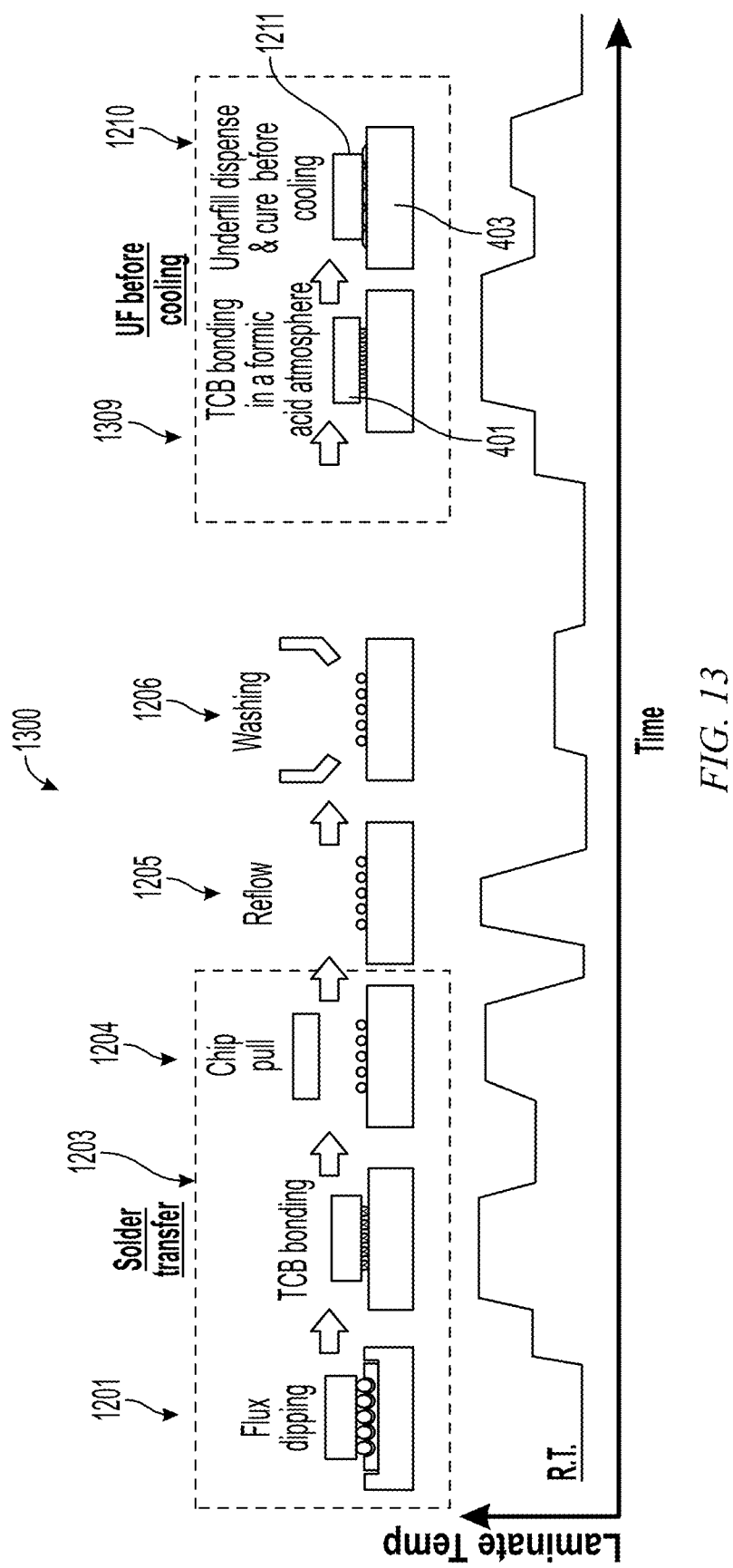
FIG. 13 depicts in a schematic another process for bonding a semiconductor chip to an organic substrate, according to an exemplary embodiment.

FIG. 13 depicts another method 1300 for bonding chip 401 to substrate 403. Steps 1201, 1203, 1204, 1205, 1206 are identical to method 1200 described with reference to FIG. 12. However, according to the method 1300, after step 1206 (flux washing), proceed to 1309, thermal compression bonding in a formic acid atmosphere. Then at 1210, without intermediate cooldown to room temperature, proceed directly to dispense and cure underfill 1211 at a temperature appropriate for the underfill material, e.g., 80° C. to 120° C.

Figure 14:
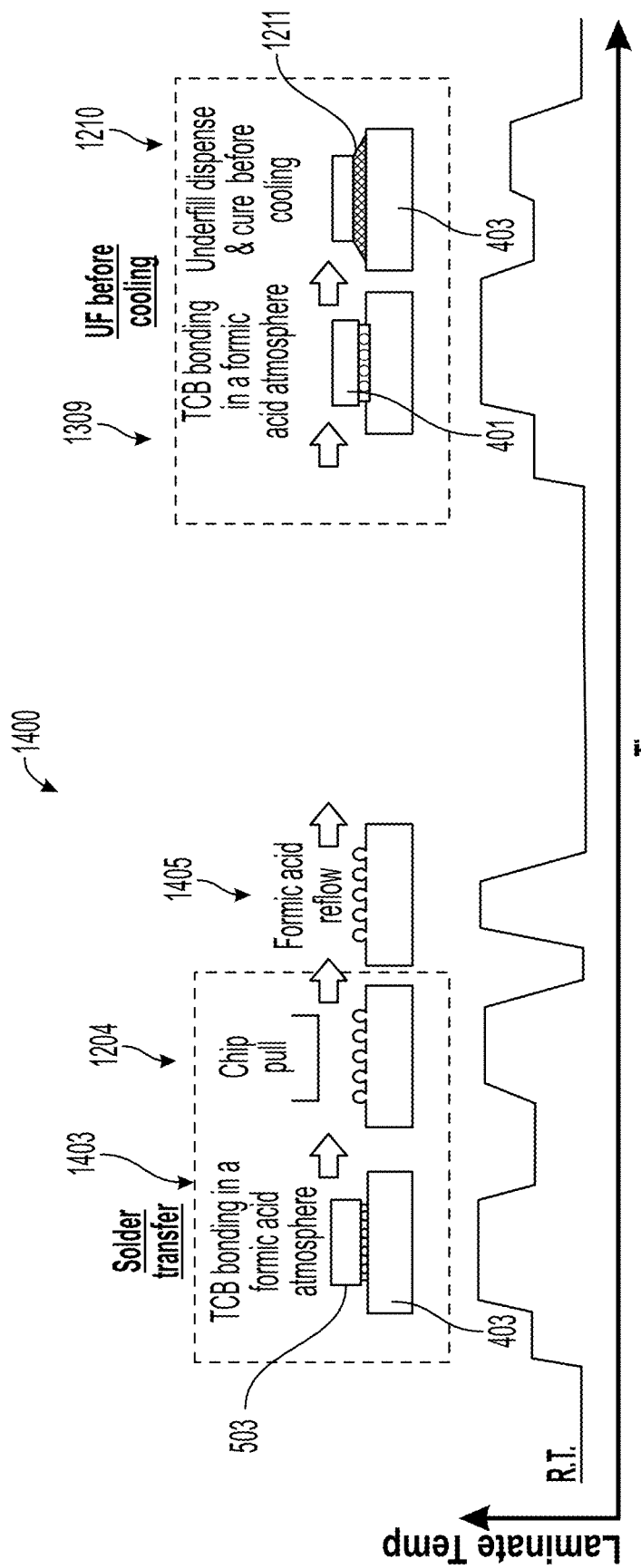
FIG. 14 depicts in a schematic another process for bonding a semiconductor chip to an organic substrate, according to an exemplary embodiment.

FIG. 14 depicts another method 1400 for bonding chip 401 to substrate 403. At 1403, thermocompression bond transfer die 503 to substrate 403. At 1204, pull the transfer die. At 1405, reflow the solder under formic acid atmosphere. At 1309, thermocompression bond the chip 401 to the substrate 403. Step 1210 is identical to methods 1200, 1300 and results in underfill 1211 between the chip 401 and the substrate 403.

Figure 15:
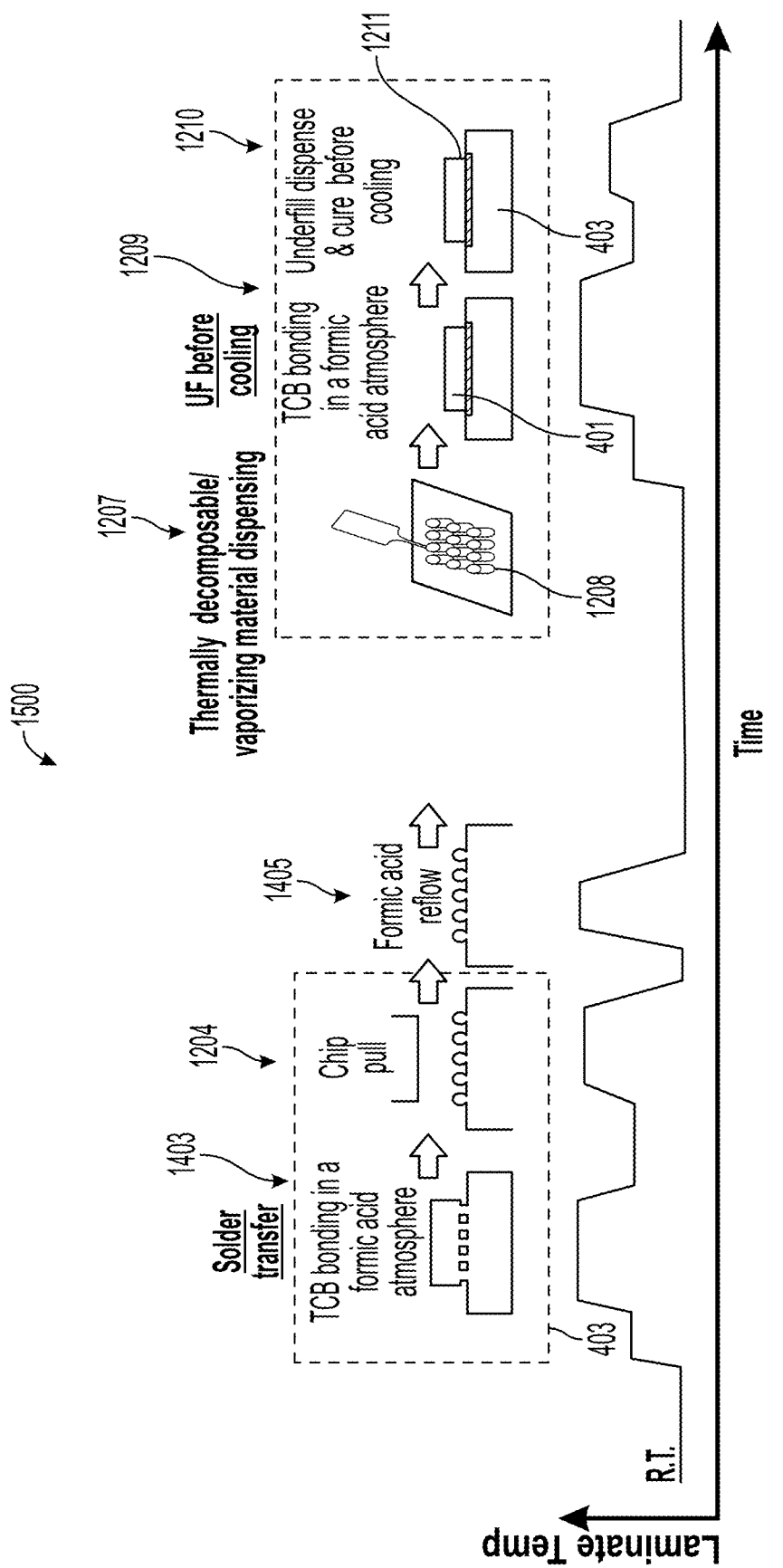
FIG. 15 depicts in a schematic another process for bonding a semiconductor chip to an organic substrate, according to an exemplary embodiment.

FIG. 15 depicts another method 1500 for bonding chip 401 to substrate 403. Step 1403 (solder transfer by thermocompression bonding) is identical to method 1400. Step 1204 (chip pull) is identical to method 1200. Step 1405 (solder reflow under formic acid atmosphere) is identical to method 1400. Steps 1207 (depositing tacky material 1208), 1209 (belt furnace bonding chip 401 to substrate 403 under formic acid atmosphere), and 1210 (underfill dispense and cure without intermediate cooldown to room temperature) are identical to method 1200; note underfill 1211. Please note, in FIG. 15, in steps 1209 and 1210, there will be micro-bumps between elements 401 and 403; these details are omitted to avoid clutter. Exemplary views of micro-bumps and underfill are provided in the other drawing figures.

Given the discussion thus far, it will be appreciated that, in general terms, an exemplary method, according to an aspect of the invention, includes at a bonding temperature, bonding a semiconductor chip to an organic laminate substrate using solder; without cooldown from the bonding temperature to room temperature, at an underfill dispense temperature, dispensing underfill between the semiconductor chip and the organic laminate substrate; and curing the underfill within a range of temperatures above the underfill dispense temperature.

In one or more embodiments, the bonding is done in a belt furnace. One or more embodiments of the method also include, before the bonding, dispensing at least two spots of a volatile tacky adhesive between the semiconductor chip and the organic laminate substrate. In one or more embodiments, the bonding is done in a formic acid atmosphere. In one or more embodiments, a vaporization temperature of the volatile tacky adhesive is matched (equal) to, or is slightly (about 5-10 degrees C.) lower than, a solidus temperature of the solder used for bonding the semiconductor chip to the organic laminate substrate (that is, the vaporization temperature of the volatile tacky adhesive is selected to be within a range from matching (equal), to no more than ten degrees C. lower than, a solidus temperature of the solder used for bonding the semiconductor chip to the organic laminate substrate).

In one or more embodiments, before the bonding, an HCl etch is applied to the semiconductor chip, and during the bonding, an atmosphere with an oxygen concentration of 100 ppm or less is maintained.

In one or more embodiments, the bonding is done using a thermocompression bond tool. In one or more embodiments, the bonding is done in a formic acid atmosphere.

In one or more embodiments, bonding is performed at 235° C. to 245° C., underfill dispense is performed at 80° C. to 120° C., and underfill cure is performed at 120° C. to 160° C.

According to another aspect, an exemplary method includes depositing a first solder on pads of an organic laminate substrate; contacting a second solder on pillars of a semiconductor chip to the first solder on the pads of the organic laminate substrate; and solder bonding the semiconductor chip to the organic laminate substrate.

In one or more embodiments, the first solder has a lower melting point than the second solder. In one or more embodiments, the first solder has a melting point of 135° C. (Celsius) to 145° C.

In one or more embodiments, the first solder has a same melting point as the second solder.

In one or more embodiments, the exemplary method includes plating the first solder onto the pillars, and depositing the first solder on the pads comprises reflowing the first solder from the pillars to the pads.

In one or more embodiments, the exemplary method includes plating the first solder onto a template die, and depositing the first solder on the pads comprises reflowing the first solder from the template die to the pads.

According to another aspect, an exemplary apparatus includes a semiconductor chip 401 that has pillars 402 protruding from a lower surface thereof at a pitch of 55 μm (microns) or smaller, with caps 406 of first solder affixed to lower ends of the pillars; an organic laminate substrate 403 that has pads 404 protruding from an upper surface thereof at the same pitch as the semiconductor chip, with caps 408 of second solder affixed to upper faces of the pads; and two or more dots of volatile tacky adhesive 1208 attaching the upper surface of the organic laminate substrate to the lower surface of the semiconductor chip.

In one or more embodiments, the second solder has a lower melting point than the first solder. In one or more embodiments, the second solder has a melting point of 135° C. (Celsius) to 145° C.

In one or more embodiments, the second solder has a same melting point as the first solder. In one or more embodiments, the first and second solders have a solidus temperature of 215° C. to 230° C.

In one or more embodiments, a vaporization temperature of the volatile tacky adhesive is such that after solder bonding the semiconductor chip to the organic laminate substrate, none of the volatile tacky adhesive remains.

Although certain embodiments are described with respect to bonding a single chip to a substrate, embodiments of the invention are equally applicable to bonding a chip package to a substrate, and wherever the term "semiconductor chip" is found in the claims it equally applies to a multi-chip package.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a semiconductor chip that has pillars protruding from a lower surface thereof at a pitch of 55 μm (microns) or smaller, with caps of first solder affixed to lower ends of the pillars;
an organic laminate substrate that has pads protruding from an upper surface thereof at the same pitch as the semiconductor chip, with caps of second solder affixed to upper faces of the pads, wherein the second solder has a lower melting point than the first solder, and the caps of first solder are larger than the caps of second solder; and
two or more dots of volatile tacky adhesive that attach the upper surface of the organic laminate substrate to the lower surface of the semiconductor chip.

2. The apparatus of claim 1, wherein the second solder has a melting point of 135° C. (Celsius) to 145° C.

3. The apparatus of claim 1, wherein a vaporization temperature of the volatile tacky adhesive is such that after solder bonding the semiconductor chip to the organic laminate substrate, none of the volatile tacky adhesive remains.

4. An apparatus comprising:
a semiconductor chip that has pillars protruding from a lower surface thereof at a pitch of 55 μm (microns) or smaller, with caps of tin-silver solder affixed to lower ends of the pillars;
an organic laminate substrate that has pads protruding from an upper surface thereof at the same pitch as the semiconductor chip, with caps of tin-bismuth solder affixed to upper faces of the pads; and
two or more dots of C-9-11-iso-C-1-rich that attach the upper surface of the organic laminate substrate to the lower surface of the semiconductor chip.

* * * * *